United States Patent [19]
Osaki et al.

[11] Patent Number: 4,783,722
[45] Date of Patent: Nov. 8, 1988

[54] INTERBOARD CONNECTION TERMINAL AND METHOD OF MANUFACTURING THE SAME

[75] Inventors: Takaaki Osaki; Norio Matsui, both of Tokyo; Shinichi Sasaki, Iruma; Yutaka Egawa, Tokyo, all of Japan

[73] Assignee: Nippon Telegraph and Telephone Corporation, Chiyoda, Japan

[21] Appl. No.: 23,552

[22] PCT Filed: Jul. 16, 1986

[86] PCT No.: PCT/JP86/00364

§ 371 Date: Feb. 19, 1987

§ 102(e) Date: Feb. 19, 1987

[87] PCT Pub. No.: WO87/00686

PCT Pub. Date: Jan. 29, 1987

[30] Foreign Application Priority Data

Jul. 16, 1985 [JP] Japan .............................. 60-156621
Jun. 13, 1986 [JP] Japan .............................. 61-137961

[51] Int. Cl.$^4$ ............................................. H05K 1/11
[52] U.S. Cl. ................................... 361/411; 174/68.5; 361/412; 439/44; 439/74
[58] Field of Search ............... 361/411, 412; 174/68.5; 439/44, 50, 69, 74

[56] References Cited

U.S. PATENT DOCUMENTS

| | | | |
|---|---|---|---|
| 3,597,834 | 8/1971 | Lathrop et al. | 174/68.5 X |
| 3,770,874 | 11/1973 | Kreiger et al. | 174/68.5 |
| 3,921,285 | 11/1975 | Krall | 361/411 X |
| 3,922,777 | 12/1975 | Weitze, II et al. | 361/411 X |
| 4,047,290 | 9/1977 | Weitze et al. | 174/68.5 X |
| 4,074,342 | 2/1978 | Honn et al. | 361/411 |
| 4,447,857 | 5/1984 | Marks et al. | 361/411 X |
| 4,529,835 | 7/1985 | Mizuno | 174/68.5 |
| 4,572,925 | 2/1986 | Scarlett | 174/68.5 |
| 4,617,730 | 10/1986 | Gelderman | 174/68.5 X |
| 4,638,400 | 1/1987 | Brown | 174/68.5 X |
| 4,685,030 | 8/1987 | Reyes et al. | 174/68.5 X |

Primary Examiner—R. R. Kucia
Attorney, Agent, or Firm—Frishauf, Holtz, Goodman & Woodward

[57] ABSTRACT

A stack layer structure is formed wherein solderable metal layers are provided at least at two ends thereof, and at least a metal layer for preventing the diffusion of solder is inserted between the two metal layers. In an interboard connection terminal and a method of manufacturing the same, a pair of solder bumps are fixed to be in contact with the two surfaces of the resultant stack layer structure.

13 Claims, 15 Drawing Sheets

(1)

(2)

(3)

(4)

(5)

(6)

F I G. 14
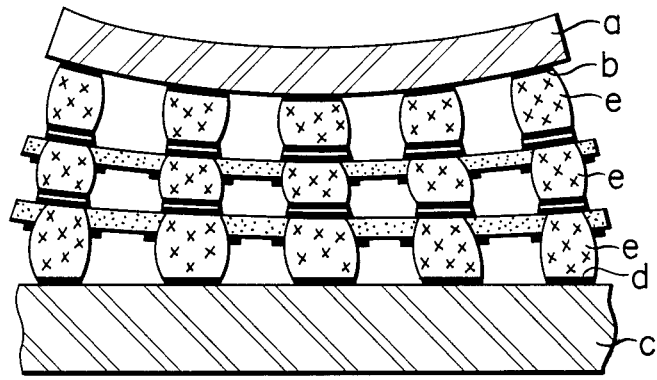
F I G. 18
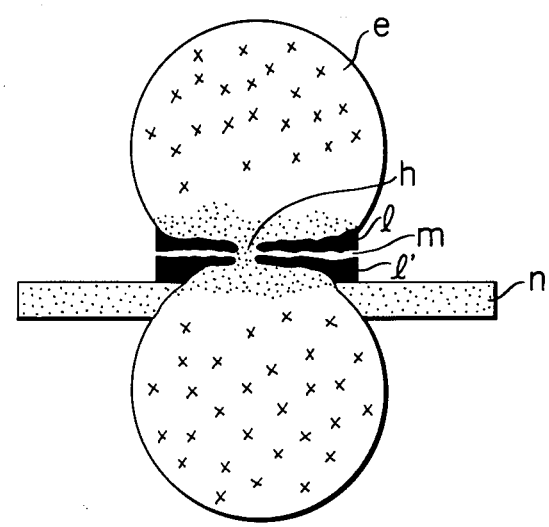

(a) 
(b) 
(c) 
(d) 
(e) 
(f) 
(g) 
(h) 
(i) 
(j)

INTERBOARD CONNECTION TERMINAL AND METHOD OF MANUFACTURING THE SAME

TECHNICAL FIELD

The present invention relates to an interboard connection terminal for connecting boards, such as a large chip and a wiring board, and a method of manufacturing the same.

BACKGROUND ART

For example, a solder bump connecting method (flip chip bonding method) as described in Japanese Patent Application Nos. 43-1654 and 43-28735 is known as a method to connect terminals of a chip and a wiring board. According to this connecting method, as shown in FIG. 1, a plurality of electrodes b formed on chip a and electrode portions d on wiring board c for supporting the same are directly bonded through solder bumps e. Since the thermal expansion coefficients of chip a and wiring board c are different from each other, a shear strain occurs in solder bumps e when the temperature changes. This shear strain increases as the distance between solder bumps e and chip center f increases. Therefore, the larger the chip size g, the fewer thermal cycles occur before a bump breaks, as shown in FIG. 2. As a result, a region capable of arranging solder bumps therein is limited, depending on an allowable shear strain. For example, when a silicon chip is to be connected to a ceramic wiring board, the best possible solder bump arrangement region is about 2.5 mm in radius from the chip center, as shown in Japanese Patent Disclosure Nos. 50-137484 and 59-996. Thus, with a conventional solder bump connecting method, since the best possible solder bump arrangement region is limited in the vicinity of the chip center, it is difficult to increase the number of terminals. Since a distance between an element located outside the best possible solder bump arrangement region in a chip and a solder bump is increased, wiring for connecting them is elongated, resulting in time required for arranging the wire. Furthermore, as shown in FIGS. 3(A) and 3(B), as the chip size is increased, gap deviation j between a chip and wiring board, depending on the warp and undulation of the chip or wiring board, is increased (gap deviation $j=j2-j1$ where $j1$ is a gap at a central portion and $j2$ is a gap at an end portion of the chip). It is difficult to absorb such gap deviation j by only a single stage of solder bumps e. In the worst case, since a vertical compressive force acts to squeeze adjacent solder bumps in the horizontal direction, as shown in FIG. 4, some terminals may be short-circuited. When the gap deviation becomes too large, a bump may be separated from either one of the boards, thus electrically disconnecting the boards.

With conventional unstacked stage solder bump connection, since the gap deviation and hence a mechanical stress cannot be sufficiently absorbed, the rear surface of a chip cannot be completely fixed to a heat sink. Therefore, cooling must be taken to prevent this, resulting in a complex cooling structure.

As a method for eliminating such drawbacks of the conventional solder bump connecting method, a method is proposed in Japanese Patent Disclosure No. 59-996. In this method, solder terminals of a chip and a wiring board are connected through through-holes formed in an intermediate board. More specifically, according to this method, as shown in FIG. 5, through-holes i are formed in intermediate board h having a thermal expansion coefficient of an intermediate value between those of chip a and wiring board e, and solder, or Ag or Cu which has solderability is charged in through hole i (charged only inside board h, as shown in FIG. 5, or charged into board h to partially project from the two surfaces of board h, as indicated by i in FIG. 6(A)), in order to decrease the shear strain caused in solder bumps e covering chip electrodes b and in solder bumps e' covering wiring board electrodes d. Electrodes b of chip a and electrodes d of wiring board c are connected to each other through solders e and e'. In this method, as shown in FIG. 6(A), intermediate board h is inserted between chip a and wiring board c, and solders e and e' are melted and connected to each other. However, since the solder is thermally melted, upper and lower solders e and e' are diffused into through-hole metal i' in which a solder, or Ag or Cu having solderability is charged, as shown in FIG. 6(B), and upper solder e is combined with lower solder e' through through-holes i. In other words, since the height of upper solder bump e'' decreases, the shear strain becomes considerably large, resulting in a shorter connection lifetime than in the first conventional example shown in FIG. 1. Also, the diameter of lower solder bump e''' is increased, and the connection solder bumps are electrically short-circuited with each other. In order to prevent this, terminal space must be increased, and a high-density terminal connection cannot thus be performed.

DISCLOSURE OF INVENTION

It is an object of the present invention to provide interboard connection terminals for a large chip which do not limit a possible solder bump arrangement region, and have a small shear strain at a solder bump portion, and a high reliability, and a method of manufacturing the same.

In order to achieve the above object, with the interboard connection terminals and a method of manufacturing the same according to the present invention, a stack layer structure is formed wherein metal layers having solderability are provided at least at two ends thereof, and at least one metal layer to stop solder diffusion is inserted between the two metal layers. A pair of solder bumps are fixed to be in contact with the two surfaces of the resultant stack layer structure.

BRIEF DESCRIPTION OF DRAWINGS

FIG. 14 shows still another embodiment of the present invention, and shows the connection state of terminals wherein the warp or undulation on the surface of a wiring board is absorbed by multistage solder bumps;

FIG. 18 is a view for explaining a state wherein either one of a pair of solder bumps partially migrates to the other when a pinhole occurs in a metal interlayer;

BEST MODE OF CARRYING OUT THE INVENTION

It is generally widely known that lifetime Nf of a solder bump portion has the following relationship with respect to a shear strain, a material constant, and a structure size (e.g., P. Lin "Design Considerations for a Flip-Chip Joining Technique", Solid State Technology, p. 48, July 1970):

$$Nf = A/\gamma^2$$

$$\gamma = \Delta\alpha \cdot g' \cdot \Delta T/H$$

where A is a constant defined by a solder material or the like, $\gamma$ is a shear strain, $\Delta\alpha$ is a difference between the thermal expansion coefficients of a chip and a wiring board, $g'$ is a distance between a solder bump farthest from the chip center and the chip center, $\Delta T$ is a temperature difference of each thermal cycle, and H is a height difference between the chip and wiring board.

Therefore, in order to decrease the shear strain, the height of the solder bump must be increased. Ideally, it is preferable to stack several solder bumps in a columnar manner, thereby increasing the overall solder bump height. When a solder bump and a chip or a wiring board are connected by melting, however, the columnar solder bump becomes a single ball by surface tension. Therefore, it is considerably difficult to obtain a high solder bump while the distance between itself and an adjacent solder bump is maintained at a predetermined value. As a method to increase the solder bump height, the present inventors have proposed the following method to stack solder bumps in a multistage manner.

Figure 1:
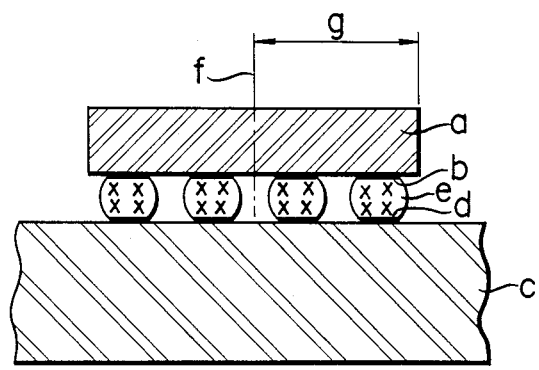
FIG. 1 is a sectional view showing an interboard connecting state using solder bumps in order to explain a conventional unstacked solder bump connecting method (flip chip bonding method)
Figure 2:
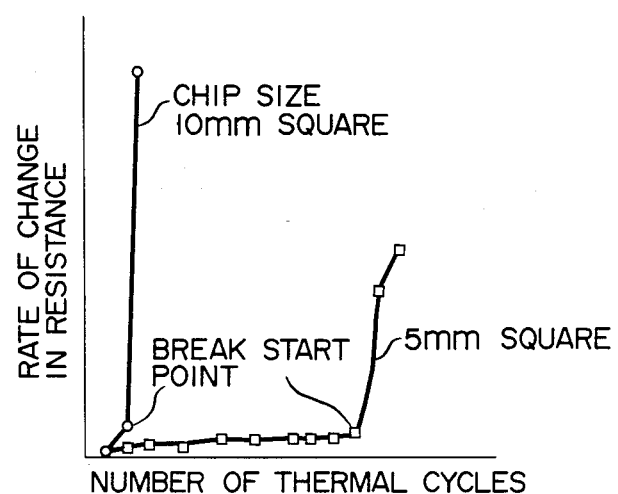
FIG. 2 is a view for explaining the relationship between the chip size and the connection service life in the conventional solder bump connecting method as shown in FIG. 1.
Figure 3:
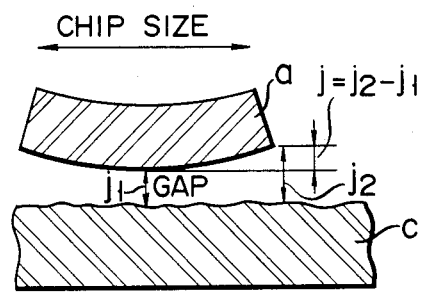
FIGS. 3(A) and 3(B) are views for explaining the relationship between the chip size and the gap deviation, respectively.
Figure 3:
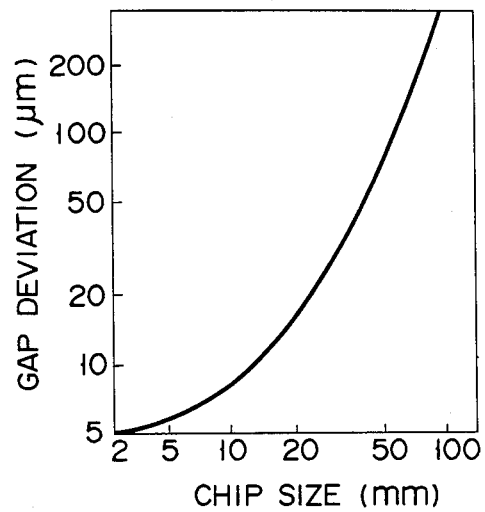
Figure 4:
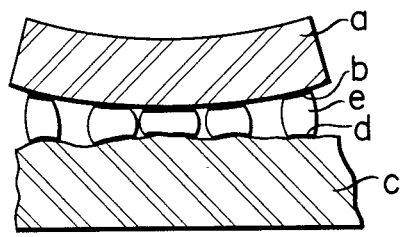
FIG. 4 is a view for explaining short-circuiting of solder bumps because of the warp or undulation of a chip or a wiring board when a large chip is used.
Figure 5:
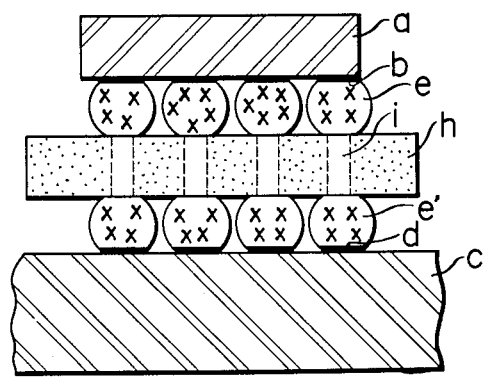
FIG. 5 is a sectional view of another conventional example and shows connection terminals of an arrangement wherein an intermediate board is inserted between a pair of solder bumps.
Figure 6:
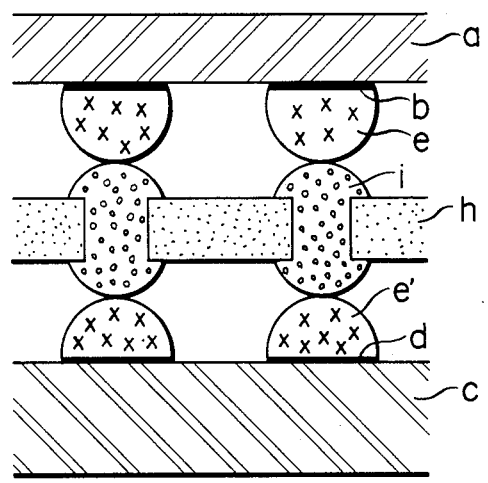
FIGS. 6(A) and 6(B) are views for explaining a conventional defective example wherein an upper solder bump is shifted by melting toward a lower solder bump and is partially integrated with it.
Figure 6:
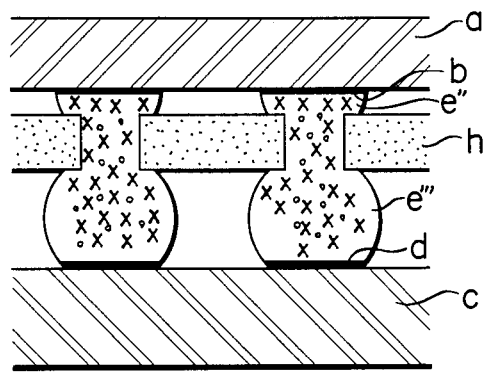
Figure 7:
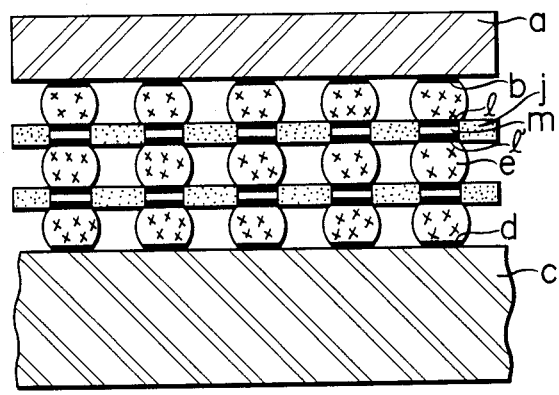
FIG. 7 shows an embodiment of the present invention, wherein a ceramic board is used as an intermediate support board, a pair of solder bumps are fixed through a metal interlayer, and interboard connection is made through a plurality of pairs of multistage connection terminals.

FIG. 7 is a view for explaining a first embodiment of the present invention. Referring to FIG. 7, reference symbol a denotes a chip; b, an electrode; c, a wiring board; d, an electrode, e, a solder bump, l, a solderable metal layer such as Cu; m, a diffusion preventive layer of, e.g., W and Mo having no wettability against solder and sandwiched between metal layers l; and j, ceramic having no wettability against solder and no electrical conductivity. Regarding metal multilayer l-m-l', both surfaces must be able to be bonded with solder, and it must prevent solder on its two surfaces from diffusing and penetrating by melting and integrating with each other. For this purpose, in the structure of the present invention, at least one W or Mo layer having no wettability but having a diffusion preventive effect is inserted between solderable Cu layers, as shown in FIG. 7.

Figure 8:
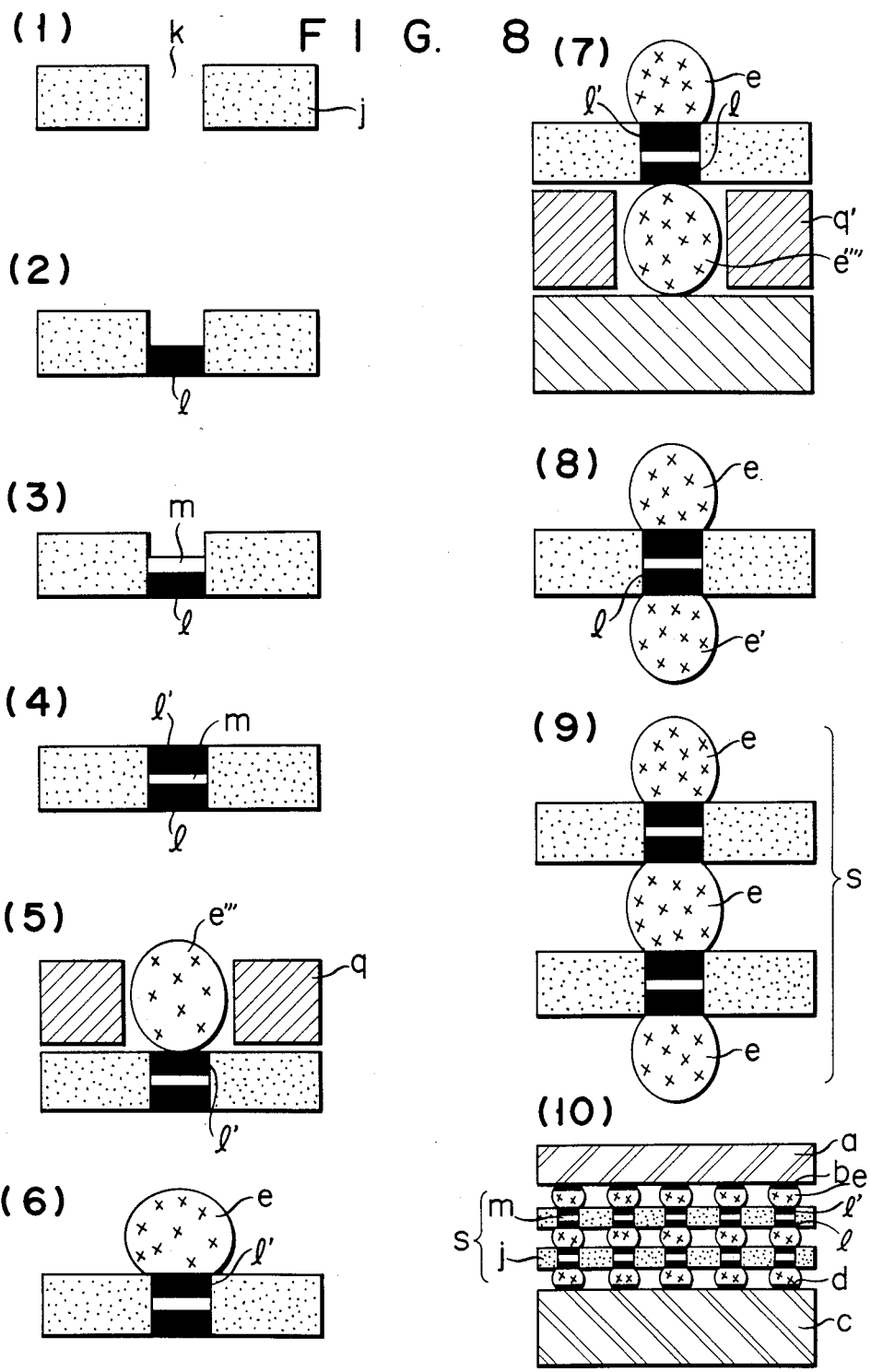
FIGS. 8(1) to 8(10) are views for showing the steps of a manufacturing method to form a connection structure shown in FIG. 7.

A method of manufacturing the first embodiment of the present invention shown in FIG. 7 will be described with reference to FIG. 8. As shown in FIG. 8(1), through-hole k, having a diameter of about 125 μm, is formed in ceramic green sheet j having a thickness of about 500 μm by punching, and sheet j is calcined. Subsequently, as shown in FIG. 8(2), solderable layers l, such as a Cu paste, is inserted in through hole k and calcined to have a thickness of about 200 μm. As shown in FIG. 8(3), layer m, such as a W paste, having no wettability against solder, is inserted onto Cu layer l and calcined to have a thickness of about 100 μm. As shown in FIG. 8(4), layer l', such as a Cu paste, having a wettability against solder, is inserted onto W layer m and calcined to have a thickness of about 200 μm. As shown in FIG. 8(5), metal mask q having an opening is aligned with a Cu (l') portion on the upper surface of the resultant structure, solder ball e‴ of SnPb or InPb is placed in the opening, and a flux is coated thereon. Subsequently, the resultant structure is placed in an electric surface to melt ball e‴ and the Cu (l') portion on the surface of the structure is bonded with ball e‴ to form solder bump e, as shown in FIG. 8(6). Subsequently, as shown in FIG. 8(7), another metal mask q' is aligned with a Cu (l) portion on the lower surface of the structure, solder ball e‴ is placed in the opening, and a flux is coated thereon. As shown in FIG. 8(8), the Cu (l) portion on the lower surface of the structure is bonded with ball e″″ to form solder bump e'. Above-described metal masks q and q' and flux need not be used as far as the structure as shown in FIG. 8(8) is formed. When a solder bump of three stages or more is to be obtained, the solder pumps shown in FIGS. 8(6) and 8(8) are stacked and melted, thereby forming multistage solder bump s, as shown in FIG. 8(9). Subsequently, using the thus-obtained multistage solder bump, electrodes b of a chip and terminals d of a wiring board are aligned to coincide with each other, a flux is coated thereon, chip a and wiring board c are connected with each other, and the flux is removed, as shown in FIG. 8(10).

In this embodiment, a ceramic support board is used. However, an interboard connection terminal can be obtained by using a flexible resin support board or a polyimide support board instead. When a polyimide support board is used, a polyimide film can be removed by etching in the last step in a similar manner to that to be described later. When a flexible insulating board is used, the polyimide film can be removed by incineration using an oxygen plasma.

Figure 9:
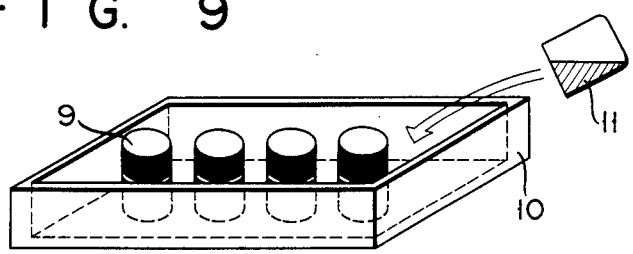
FIGS. 9(1) to 9(6) are views for showing the steps of separately arranging a plurality of connection terminals.
Figure 9:
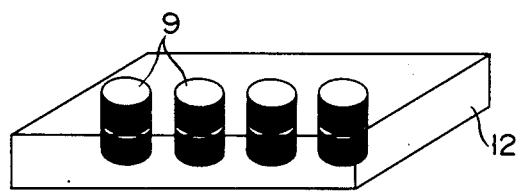
Figure 9:
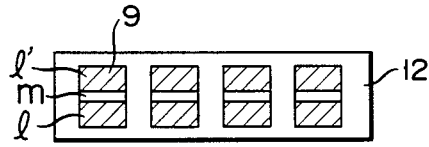
Figure 9:
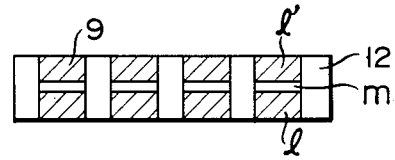
Figure 9:
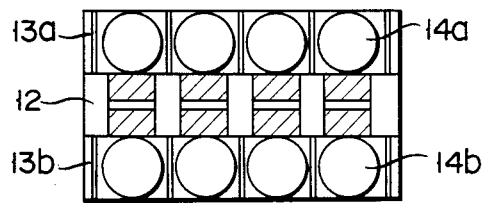
Figure 9:
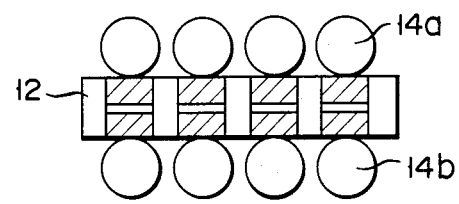

FIGS. 9(1) to 9(6) show another embodiment of a method wherein a plurality of three-layered metal interlayers described above are separately arranged within a single support board, and solder bumps are fixed on the respective metal interlayers. As shown in FIG. 9(1), a plurality of metal interlayers 9 are separately arranged in frame member 10 at predetermined intervals. A molten resin, such as a polyimide film, or a flexible insulator, is charged in frame member 10 and solidified, and frame member 10 is removed as shown in FIGS. 9(2) and 9(3). Subsequently, as shown in FIG. 9(4), the two surfaces of the resin member are polished to form support board member 12. Then, as shown in FIG. 9(5), masks 13a and 13b, having through-holes corresponding to metal interlayers 9, are arranged on the two surfaces of board member 12 and solder bumps 14a and 14b are inserted in the corresponding through-holes. Solder bumps 14a and 14b are heated and melted to be fixed on the two surfaces of metal interlayer 9, as shown in FIG. 9(6).

Figure 10:
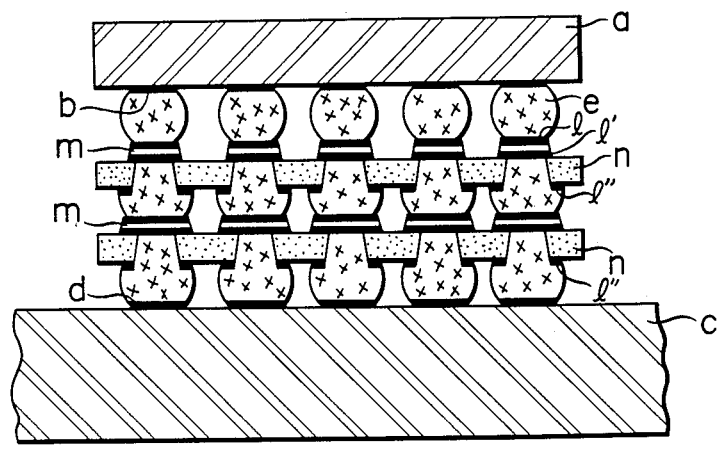
FIG. 10 shows another embodiment of the present invention, and shows the connection state of connection terminals using a polyimide resin film as an intermediate board.

FIG. 10 is a view for explaining another embodiment of the present invention, in which reference symbol a denotes a chip; b, an electrode; c, a wiring board; d, an electrode; e, a solder bump; l, l', and l", metal layers such as Cu metal layers having a wettability against solder; m, a diffusion preventive layer of, e.g., Ti, which has no wettability against solder and is inserted between metal layers l and l'; and m, a heat-resistant resin film such as a polyimide film.

Figure 11:
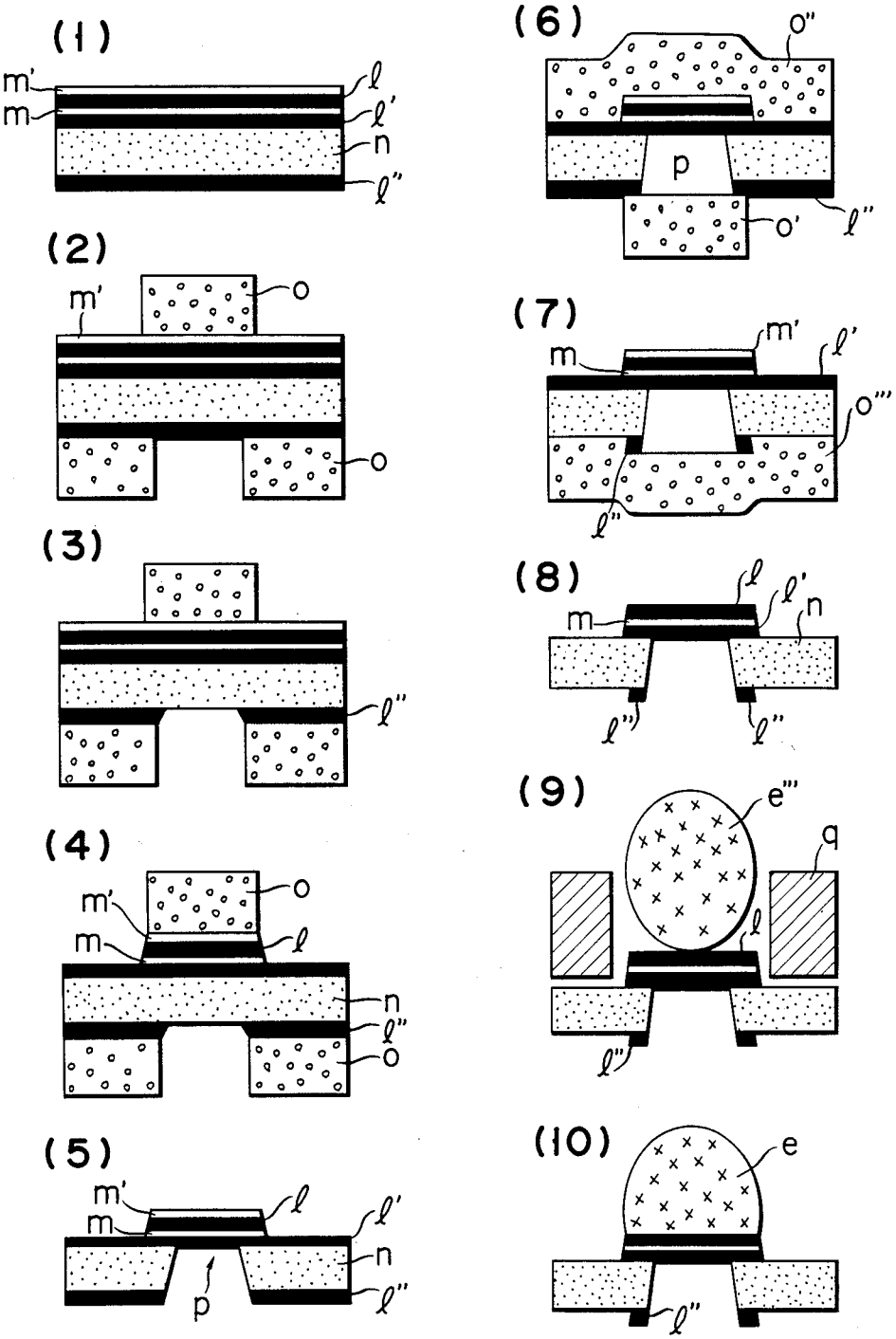
FIGS. 11(1) to 11(15) are views for showing the steps of a manufacturing method to form the connection structure shown in FIG. 10.
Figure 11:
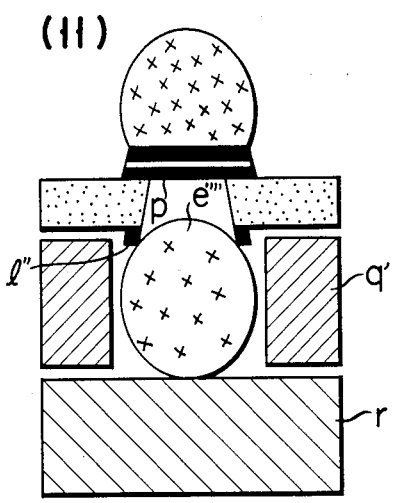
Figure 11:
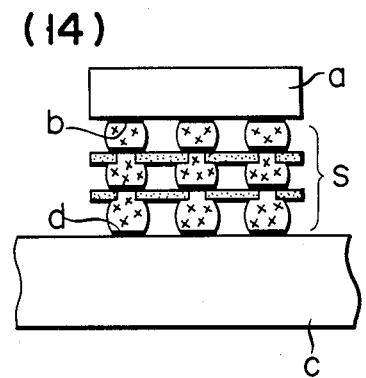
Figure 11:
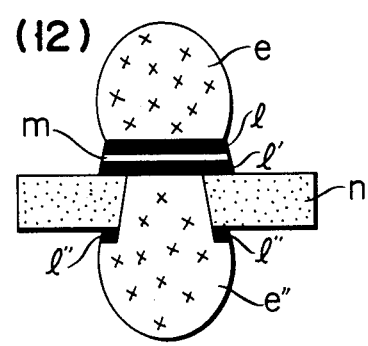
Figure 11:
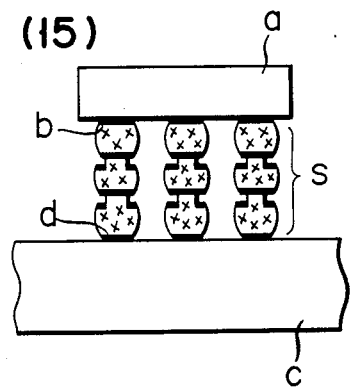
Figure 11:
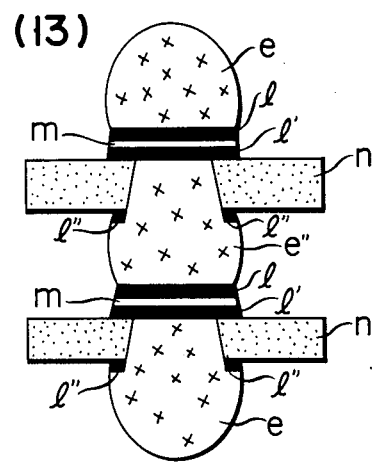

The method of manufacturing the embodiment of the present invention shown in FIG. 10 will be described with reference to FIG. 11. As shown in FIG. 11(1), polyimide film n having a thickness of about 12.5 to 25 $\mu$m is prepared as a base. Cu (about 5-$\mu$m thickness), Ti (0.2- to 1-$\mu$m thickness), Cu (about 5-$\mu$m thickness, and Ti (about 0.2-$\mu$m thickness) are continuously deposited on the upper surface of film n by vacuum deposition or the like, and Cu (about 2-$\mu$m thickness) l" is applied on the lower surface of film n. Subsequently, as shown in FIG. 11(2), film-type resists (dry films) having a thickness of about 50 $\mu$m are laminated on two surfaces of the resultant structure. The resultant structure is sandwiched between two masks aligned in advance. The two surfaces of the resultant structure are exposed and film-type resists o are developed using a developer such as trichloroethane to obtain a desired pattern. Subsequently, as shown in FIG. 11(3), Cu (l") on the lower surface of the structure is etched using an aqueous solution of ammonium persulfate or the like which has selectivity against Ti. As shown in FIG. 11(4), Ti (m') is etched using an aqueous solution of hydrofluoric acid or the like which has selectivity against Cu and by using film-type resist o on the upper surface of the structure as a mask. Cu (l) is etched using an aqueous solution of ammonium persulfate or the like, and finally Ti (m) is etched using an aqueous solution of hydrofluoric acid or the like. Then, after film-type resists o are removed using acetone or the like as shown in FIG. 11(5), polyimide film n is etched with an aqueous solution of hydrazine or the like by using Cu (l") on the lower surface of the structure as a mask, thereby obtaining opening p. Subsequently, as shown in FIG. 11(6), a film-type resist is laminated and developed on the lower surface of the structure, thereby obtaining resist o' with a pattern slightly larger than opening p, and resist o" of the illustrated pattern on the upper surface of the structure. Using resists o' and o" as masks, Cu (l") on the lower surface of the structure is etched with an aqueous solution of ammonium persulfate or the like, the film-type resist is removed using acetone or the like, film-type resist o'" is laminated again, as shown in FIG. 11(7), and Cu (l') on the upper surface of the structure is etched with an aqueous solution of ammonium persulfate or the like. Subsequently, as shown in FIG. 11(8), Ti (m') is etched with an aqueous solution of hydrofluoric acid or the like, and resist o'" on the lower surface of the structure is removed using acetone or the like. Then, as shown in FIG. 11(9), metal mask q, having an opening, is aligned with a Cu (l) portion on the upper surface of the structure. Solder ball e'" of SnPb, InPb, or the like is placed in the opening and a flux is coated thereon. Note that mask q and the flux need not always be used in this embodiment. The resultant structure is placed in an electric furnace to melt ball e" to bond Cu (l) on the upper surface of the structure with it, as shown in FIG. 11(10), thus providing solder bump e. Subsequently, as shown in FIG. 11(11), another metal mask q' is aligned with film opening p. Solder ball e'" is placed in opening p and a flux is coated thereon. As shown in FIG. 11(12), Cu (l') on the lower surface of the structure is bonded with ball e" thus providing solder bump e'. The Cu (l") ensures the adhesion between bump e' and polyimide film n. When a solder bump of three stages or more is to be obtained, the solder bumps shown in FIGS. 11(10) and 11(12) are stacked and melted, thereby forming multistage solder bump s as shown in FIG. 11(13). Using multistage bump s fabricated in this manner, chip electrode b and wiring board electrode d are aligned to correspond to each other, as shown in FIG. 11(14), and a flux is coated thereon. Chip a and wiring board c are then connected and the flux is removed. It is also possible to remove polyimide film n thereafter by etching using hydrazine or the like. In this case, solder bump e is bonded only through metal multilayer l-m-l'. FIG. 11(15) shows this state.

The present invention is not limited to the above embodiments. The manufacturing methods and sizes can be changed within the spirit and scope of the claims of the present invention. For example, as a metal multilayer, Cu-Cr-Cu, Cu-CuCr alloy-Cr-CuCr alloy-Cu, Cu-CuTi alloy-Ti-CuTi alloy-Cu, Pd-Ti-Pd, Pd-Cr-Pd, Cu-Cr-Pd, Cu-Ti-Pd, or a structure obtained by stacking these can be adopted. In other words, in the present invention, portions contacting the solder need consist of a solderable metal, and at least one solder diffusion preventive layer need be formed between these metal portions. As a result, a plurality of layers (another metal is sandwiched between these layers) can be provided as the solder diffusion preventive layer. The two end portions of the structure that contact the solder need not consist of the same metal, but various combinations are possible. The surface of Cu can be covered with Au in order to prevent oxidation of Cu contacting the solder. Also, materials having different melting points may be used for the solder bumps of the respective stages to facilitate fusing connection of the chip and wiring board by utilizing the difference in melting point. More specifically, when the solder bumps of the respective stages consist of $Sn_{0.05}Pb_{0.95}$ (having a melting point of 314° C.), $In_{0.50}Pb_{0.50}$ (having a melting point of 215° C.), and $Sn_{0.63}Pb_{0.37}$ (having a melting point of 184° C.) in the order of manufacturing steps, only a required portion of a solder bump can be melted without fusing a solder bump that has been fused in a prior step, and unnecessary diffusion of the solder into a metal layer can be prevented, thereby suppressing degradation in connection reliability. Furthermore, as a method for forming a solder layer, a deposition method can be used in addition to the method described here.

Figure 12:
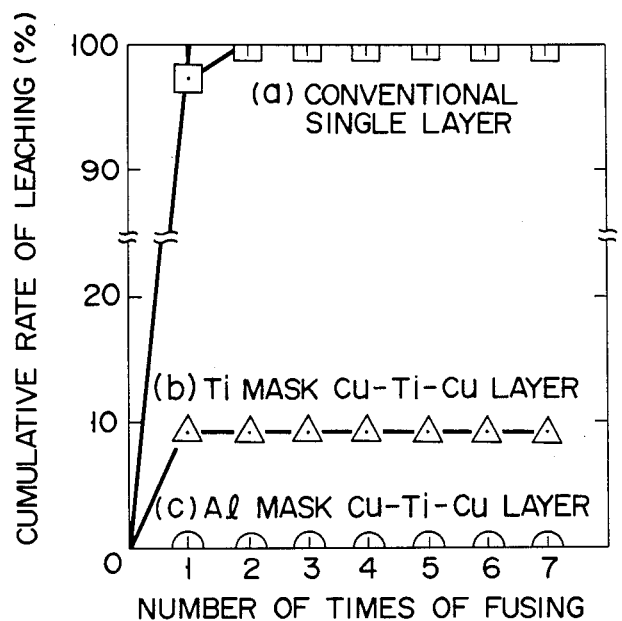
FIG. 12 shows the relationship between the number of times of fusing and the cumulative rate of leaching.

The number of times of fusing must be at least 3, as shown in FIGS. 8(5), 8(7) and 8(10), or in FIGS. 11(9), 11(11), and 11(14). FIG. 12 shows the relationship between the number of times of fusing of solder and the rate of leaching (the rate at which solder is diffused and migrates into a metal layer by fusing and the upper and lower solders are integrated). From FIG. 12, it is seen that when a structure (b) in which W or Ti layer is inserted between Cu layers is compared with a conventional single layer structure (a), the former is free from etching and is thus better than the latter.

Figure 13:
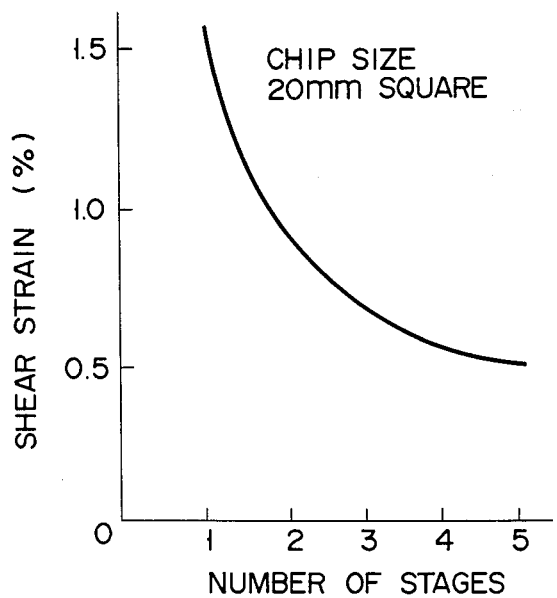
FIG. 13 is a view for explaining that a shear strain is decreased when multistage solder bumps are formed.

FIG. 13 shows an analysis result of the relationship between the number of stages of stacked solder bumps and a shear strain occurring in a solder bump portion. When the number of stages of solder bumps is increased, the shear strain can be decreased, thus improving the connection reliability from the formula described above. Therefore, even if the chip size is increased, the shear strain can be suppressed below an allowable value by increasing the number of stages of solder bumps. As a result, the limitation on the possible solder bump arrangement region is rendered less strict, and a solder bump can be arranged at an arbitrary position of a chip.

The reason why the shear strain can be decreased with the structure of the present invention will be described below.

As described above, generally, a shear strain in a solder bump portion decreases with an increase in its height. Assume that the structure consists only of a metal multilayer, and the thermal expansion coefficient, Yong's modulus, and Poisson's ratio (concerning a modulus torsion) of a solder bump and a metal layer Cu-Ti-Cu which are directly associated with the shear strain are different, as shown in Table 1. In spite of that, the solder bumps, which are adjacent to each other in a structure wherein the support board is melted in the last step are not coupled to each other through an intermediate board or the like, as shown in FIG. 11(15), and can be freely deformed in units of solder bump rows. Therefore, the effect of reducing the shear strain by forming stacked solder bumps and hence increasing the height of the connecting portion is not substantially degraded.

Assume that the structure has an intermediate board as shown in FIG. 11(14). In this case, a thin polyimide film is added to the Cu-Ti-Cu metal layer. In this case, even if the thermal expansion coefficient of the intermediate board is larger than that of a chip or wiring board, since their Young's moduli are small, i.e., since the chip and wiring board are soft and a difference in material constant from that of a solder bump is small, the shear strain can be decreased by forming multistage solder bumps and hence increasing the height of the connecting portion. Actually, the shear strain is deeply related not only to the thermal expansion coefficient but also to the Young's modulus and Poissons's ratio (concerning the modulus torsion) representing the hardness of a material. More specifically, as shown by prior techniques, even when an intermediate board having a thermal expansion coefficient of an intermediate value between those of a chip and a wiring board is used, since the intermediate board has a large Young's modulus and is thus hard, the shear strain cannot be decreased. However, even when the thermal expansion coefficient of an interlayer or an intermediate board is larger than that of a chip or a wiring board, as in the structure consisting of only an interlayer or an intermediate board structure in which a thin polyimide film is added to the interlayer structure, as described in the present invention, since the solder bumps of the respective rows can be independently deformed and since the intermediate board has a small Young's modulus and hence is soft, the shear strain can be greatly reduced by forming multistage solder bumps and increasing the height of the connecting portion.

TABLE 1

Material Constant of Major Materials Constituting Connecting Portion

| Material | Young's Modulus $(kg/mm^2)$ | Poisson's ratio | Thermal Expansion $(deg^{-1})$ |
|---|---|---|---|
| Chip (Silicon) | $1.9 \times 10^4$ | 0.30 | $2.5 \times 10^{-6}$ |
| Solder (PbSn) | $3.1 \times 10^2$ | 0.24 | $29.0 \times 10^{-6}$ |
| Wiring board (Ceramic) | $3.0 \times 10^4$ | 0.30 | $6.5 \times 10^{-6}$ |
| Intermediate board (SiC) | $4.0 \times 10^4$ | 0.13 | $4.0 \times 10^{-6}$ |
| Intermediate board (polyimide resin) | $3.0 \times 10^2$ | 0.45 | $66.7 \times 10^{-6}$ |
| Metal multilayer (Cu, Ti) | $(12 \text{ to } 13) \times 10$ | 0.32 to 0.34 | $(9 \text{ to } 17) \times 10^{-6}$ |

Regarding absorbing properties of the gap deviation between a chip and a wiring board that occurs increasingly because of the warp or undulation as the chip size is increased, a conventional one-stage structure or a two-stage structure using an intermediate board having no flexibility can absorb a gap deviation of only one stage of solder bumps. In contrast to this, the structure of the present invention can absorb a gap deviation of substantially several stages of solder bumps, since it uses a flexible thin polyimide film, even if it has an intermediate board.

Table 2 shows an analytical comparison of electrical characteristics and connection lengths between a conventional structure wherein two solder bump stages are stacked using an intermediate board having, as a base, a ceramic, such as SiC, which has a thermal expansion coefficient of an intermediate value between those of a chip and a wiring board, and the structure of the present invention. In the embodiment described above, since the connecting portion is short and has a small capacitance, its capacitance and inductance can be set to be very low compared to those in the conventional structure. As a result, terminal connection with a short signal propagation delay-time and small interterminal cross talk, i.e., good RF electrical characteristics can be performed.

TABLE 2

Comparison in Electrical Characteristics and Connection Length

| Structure | Capacitance | Inductance | Connection Length | Terminal Distance |
|---|---|---|---|---|
| Conventional | 280 fF (about 42*) | 150 pH | 700 μm | 250 μm |
| Present Invention | 3 fF (about 3.7*) | 17 pH | 213 μm | 250 μm |

*Dielectric constant of the intermediate board

As shown in FIG. 14, in this embodiment, since a thin polyimide film having flexibility is used as an intermediate support board, the respective solder bumps can be freely deformed, and a gap deviation caused between a chip and a wiring board because of a warp or undulation in the wiring board when a large chip is used can be sufficiently absorbed.

Figure 15:
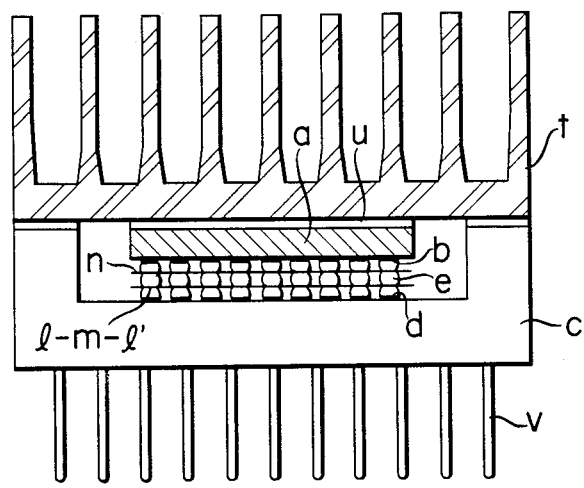
FIGS. 15(A) and 15(B) are sectional views of an integrated circuit package having a heat sink incorporating the connection terminal of the present invention, respectively, and show a single chip and multi chips, respectively.
Figure 15:
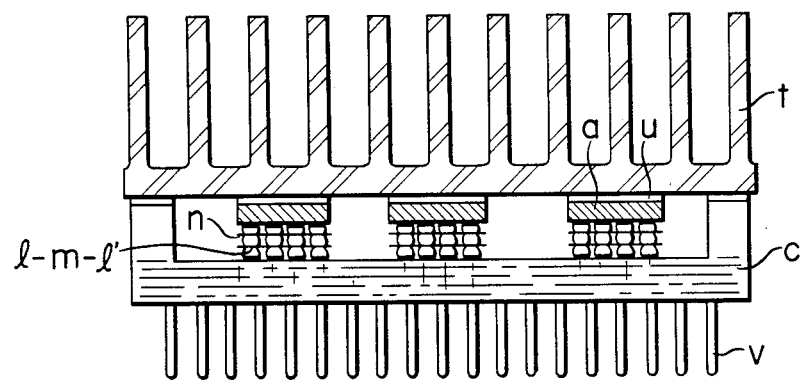

FIGS. 15(A) and 15(B) are sectional views, respectively, of an example of an integrated circuit package which uses the multistage solder bumps of this embodiment of the present invention and has a heat sink. FIGS. 15(A) and 15(B) show single and multi chips, respectively. Reference symbol a denotes a chip; b, an electrode; c, a wiring board; d, an electrode; e, a solder bump; l-m-l', a metal multilayer; n, a polyimide resin film; t, a heat radiation fin of the heat sink; u, a fixing portion by a low-melting solder; and v, a terminal pin. Since a flexible stacked solder bump is used as the chip terminal, the rear surface of the chip can be fixed to the heat sink with a low-melting solder or the like which has a good thermal conductivity. As a result, most of the heat generated in the chip is transmitted to the heat radiation fin through a solid body. Thus, an integrated circuit package having a small thermal resistance in the heat path from the chip to the fin and a good cooling property can be provided.

Figure 16:
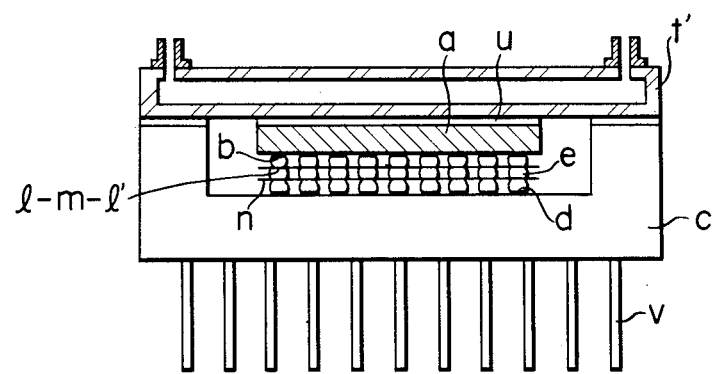
FIGS. 16(A) and 16(B) are sectional views of an integrated circuit package having cold plate in place of the heat radiation fin of the structures of FIGS. 15(A) and 15(B), respectively.
Figure 16:
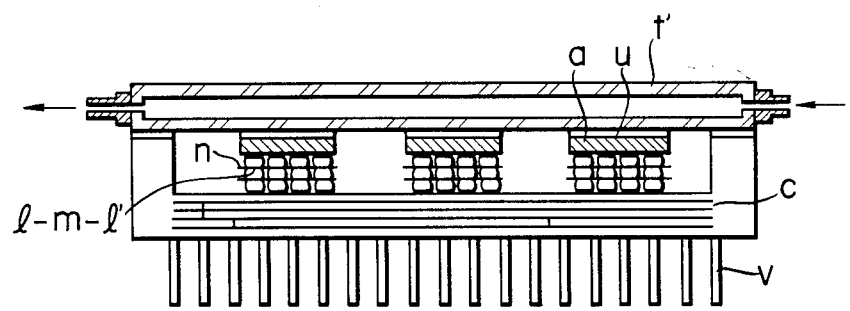

As shown in FIGS. 16(A) and 16(B), another integrated circuit package can also be provided in which the fin of the above integrated circuit package is replaced by a cold plate having at least one coolant pipe. A stacked solder bump from which a flexible polyimide resin film of an intermediate support board has been removed can also be used. Furthermore, the nap can be fixed to the heat sink with an adhesive or the like having a good thermal conductivity.

Still another embodiment of the present invention will be described. According to this embodiment, when a metal multilayer is to be formed, a connection terminal can be manufactured in accordance with a method using aluminum (Al) as a mask member or a method using plating to provide a metal multilayer, while preventing formation of a pinhole even by a low-temperature deposition, and hence preventing the solder from penetrating through the pinhole portion when the solder bump is fused.

Figure 17:
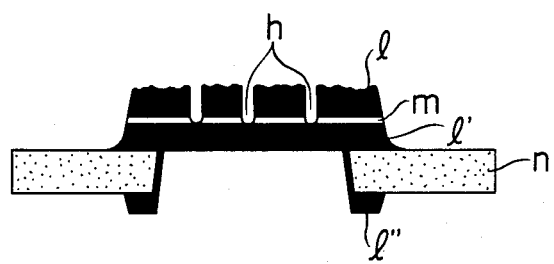
FIG. 17 is a sectional view for explaining a state wherein pinholes occur in a metal interlayer.

Generally, when a metal is vacuum-deposited, a sample may be heated to a high temperature for deposition, thereby obtaining a pinhole-free, dense metal film. For example, assume that Cu (l')-Ti(m)-Cu (l)-Ti(m') are sequentially deposited on a polyimide film as a board. In this case, when the board is heated to a high temperature, since the metal films are formed while the board is deformed by thermal expansion, pattern formation in the following process becomes difficult. Such thermal expansion can be prevented by performing low-temperature deposition. However, when Ti is used as the mask member in patterning the metal multilayer, since Ti deposited at a low temperature is porous, the etchant permeates to Ti of the mask, and pinhole h reaching the Cu (l) layer and the Ti (m) interlayer forms, as shown in FIG. 17.

Therefore, when the Ti mask member is removed with an aqueous solution of hydrofluoric acid or the like, if it is etched to the Ti (m) interlayer through the pinhole and the solder bump is thermally fused, as shown in FIG. 18, the upper and lower solders penetrate from the pinhole portion and are combined with each other.

In order to remove this drawback, an embodiment using aluminum (Al) as the mask member will be described with reference to FIGS. 19(a) to 19(i).

Figure 19:
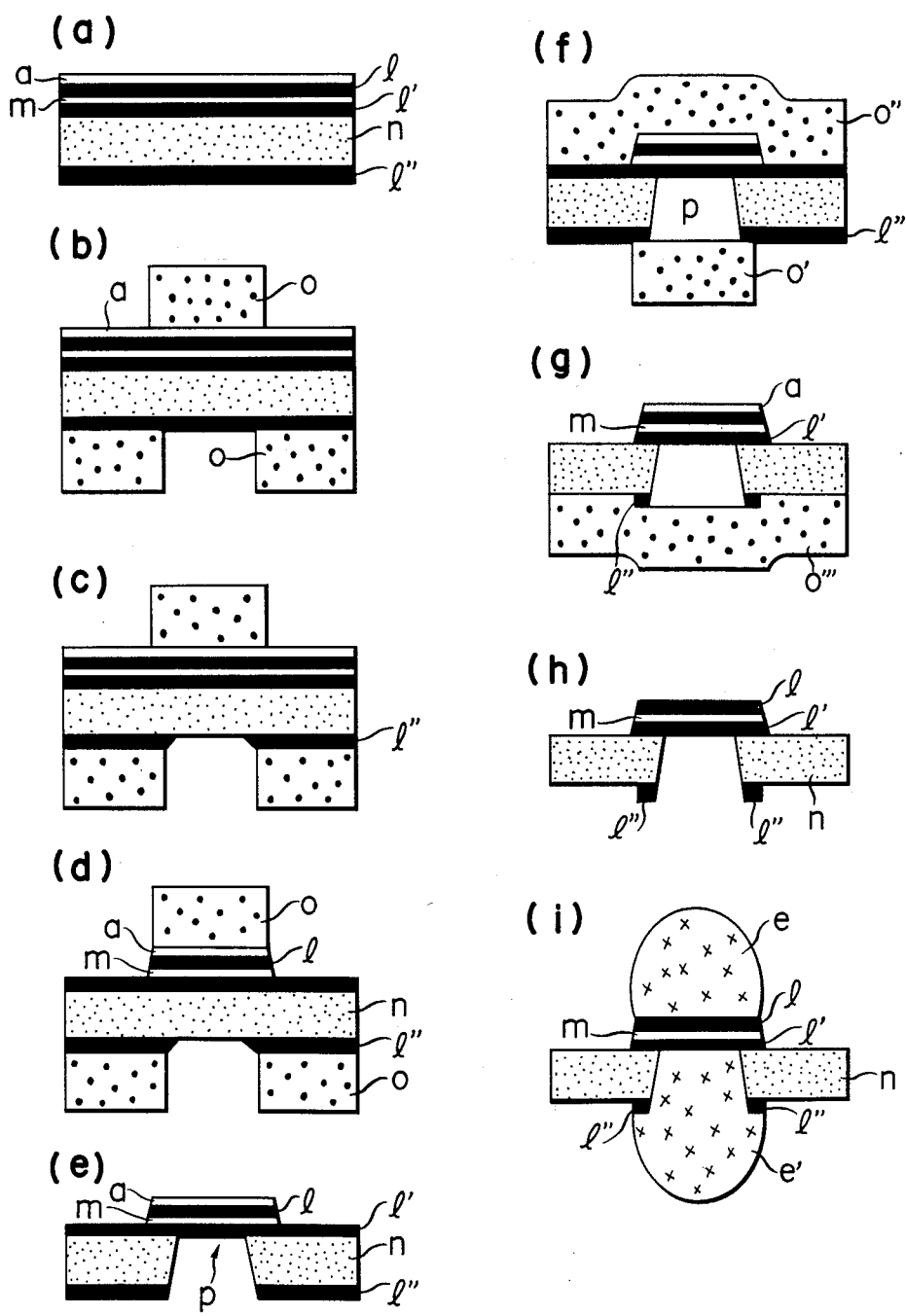
FIGS. 19(a) to 19(i) are views showing the steps of a manufacturing method according to an embodiment of the present invention wherein no pinhole occurs.

As shown in FIG. 19(a), using polyimide film n having a thickness of about 12.5 to 25 μm as a base material, Cu (about 5-μm thickness), Ti (about 0.2- to 1-μm thickness), Cu (about 5-μm thickness), and Al (about 0.5- to 1-μm thickness) are sequentially deposited on the upper surface of film n by vacuum deposition, and Cu (about 2-μm thickness) is formed on the lower surface of film n. Subsequently, as shown in FIG. 19(b), film-type resists (dry films) having thicknesses of about 50 μm are laminated on the two surfaces of the resultant structure. The resultant structure is then sandwiched between two masks aligned in advance, its two surfaces are exposed, and film-type resists o are etched using a developer such as trichloroethane, thereby obtaining a desired pattern. Then, as shown in FIG. 19(c), the Cu (l") portion on the lower surface of the structure is etched with an aqueous solution of ammonium persulfate or the like which has a selectivity against Al and Ti. As shown in FIG. 19(d), the Al (a) portion is etched using resist o on the upper surface of the structure and with hydrochloric acid or the like which has a selectivity against Cu, the Cu (l) portion is etched with an aqueous solution of ammonium persulfate, and finally the Ti (m) portion is etched with an aqueous solution of hydrofluoric acid, which has a selectivity against Al and Cu. Then, resists o are removed using acetone or the like, as shown in FIG. 19(e), and polyimide film n is etched using the Cu (l") portion on the lower surface of the structure as a mask and with an aqueous solution of hydrazine or the like, thereby obtaining opening p. As shown in FIG. 19(f), a film-type resist is laminated and developed on the lower surface of the structure, thereby obtaining pattern o', slightly larger than opening p, and resist o" of the illustrated pattern on the upper surface of the structure. Subsequently, the Cu (l") portion on the lower surface of the structure is etched using film-type resists o' and o" as masks and with an aqueous solution of ammonium persulfate or the like, and the film-type resists are removed using acetone or the like. As shown in FIG. 19(g), film-type resist o'" is laminated again and the Cu (l') portion on the upper surface of the structure is etched with an aqueous solution of ammonium persulfate or the like. The Al (a) portion is etched using hydrochloric acid or the like, as shown in FIG. 19(h). Thereafter, resist o" on the lower surface of the structure is removed using acetone or the like, thereby forming a metsal multilayer. A small solder ball is placed at the Cu (l) portion on the upper surface of the structure through the mask, thermally fused and cooled to fix, thus forming a basic structure, as shown in FIG. 19(i), wherein the solder bump is fixed.

The manufacturing method is not limited to the first embodiment but can be varied within the scope of the claims of the present invention. For example, as a mask material, an Al-Si or Al-Cu alloy containing a trace amount of other materials can be used. Cr formed by plating can be used as the mask material.

Figure 20:
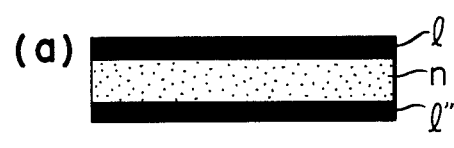
FIGS. 20(a) to 20(j) are views showing the steps of a manufacturing method according to another embodiment of the present invention wherein no pinhole occurs.
Figure 20:
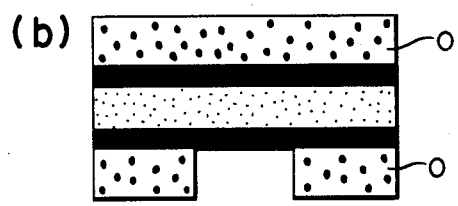
Figure 20:
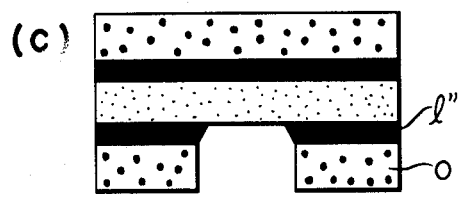
Figure 20:
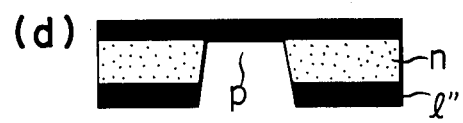
Figure 20:
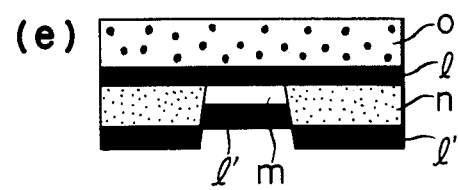
Figure 20:
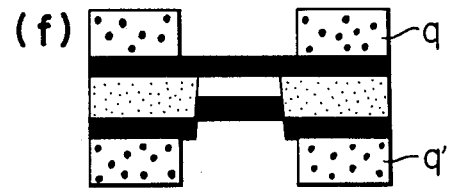
Figure 20:
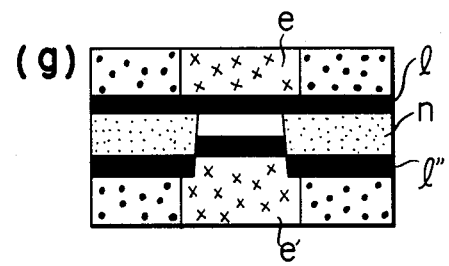
Figure 20:
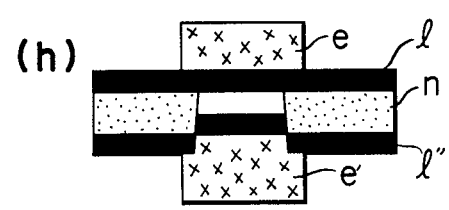
Figure 20:
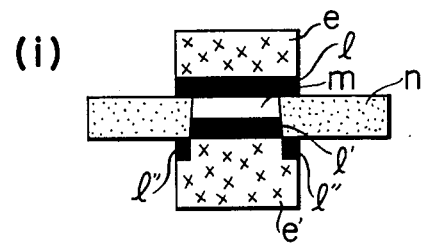
Figure 20:
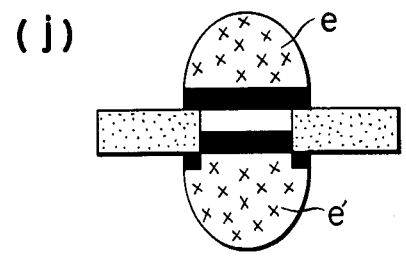

FIG. 20 shows another embodiment of a method of forming a metal multilayer at a low temperature.

The processes of forming a metal multilayer by plating or the like will be described with reference to FIG. 20. As shown in FIG. 20(a), polyimide film n having a thickness of about 12.5 to 25 $\mu$m is used as the base material, and Cu (about 5-$\mu$m thickness) l and Cu (about 2-$\mu$m thickness) l″ are formed on its upper and lower surfaces, respectively, by applying a Cu foil by deposition, sputtering, or an adhesive that is hardened at normal temperature. Subsequently, as shown in FIG. 20(b), film-type resists (dry films) having thicknesses of about 50 $\mu$m are laminated on the two surfaces of the resultant structure. The lower surface of the structure is then exposed, and film-type resist o is developed using trichloroethane or the like, thus obtaining a desired pattern. As shown in FIG. 20(c), the Cu (l″) portion on the lower surface of the structure is etched with an aqueous solution of ammonium persulfate or the like. Resists o are removed using acetone or the like, as shown in FIG. 20(d), and film n is etched using the Cu (l″) portion on the lower surface of the structure as a mask and with an aqueous solution of hydrazine or the like, thereby obtaining opening p. Subsequently, as shown in FIG. 20(e), a film-type resist is laminated on the upper surface of the structure. Cr metal layer m, having no solderability, is formed in opening p by plating. A l′ portion of Cu or the like, having solderability, is plated in an aqueous solution of copper sulfate or the like, thereby forming a Cu film having a thickness of about 5 $\mu$m. Subsequently, as shown in FIG. 20(f), film-type resists (dry films) having thicknesses of about 50 to 100 $\mu$m are laminated and developed on the upper and lower surfaces of the structure, in order to obtain resist patterns q and q′ having openings slightly larger than opening p. Using resists q and q′ as masks, solder layers (50- to 100-$\mu$m thick) are formed on portions l and l′ on the upper and lower surfaces of opening p by plating in a borofluoride solution or the like, as shown in FIG. 20(g). The film-type resists are removed using acetone or the like, as shown in FIG. 20(h), and Cu (l) and Cu (l″) portions on the upper and lower surfaces of the structure are etched using solder layers e and e′ as masks and with an aqueous solution of ammonium persulfate or the like, as shown in FIG. 20(i). The resultant structure is placed in an electric furnace to melt the solder, thereby forming a solder bump as an interboard connection element (FIG. 20(j)).

The present invention is not limited to the above embodiments. For example, when solder layers are to be formed, Pb and Sn layers can be formed separately. As is apparent from FIG. 12 described above, the metal multilayer according to the manufacturing method of the present invention is superior to one according to the conventional manufacturing method using Ti as a mask material, since it is free from solder penetration.

In the manufacturing method using plating, a metal multilayer having a good adhesion strength can be formed. The number of times mask alignment is performed can be decreased throughout the entire processes of manufacturing a solder bump compared to the conventional method, and the patterning precision can be increased. As a result, a more dense terminal structure can be obtained.

We claim:

1. An interboard connection terminal comprising:
    at least one metal layer adapted to prevent diffusion of solder and having two opposed surfaces;
    a pair of opposed, thin, solderable metal layers stacked one on each of said opposed surfaces of the metal layer; and
    a pair of solder bumps fused and adhered one on each outer surface of said pair of solderable metal layers.

2. An interboard connection terminal comprising:
    a metal interlayer of a three-layer structure consisting of a non-solderable metal layer having two opposed surfaces and adapted to prevent diffusion of solder, and a pair of thin metal layers stacked one on each of the opposed surfaces of the non-solderable metal layer; and
    a pair of solder bumps fused and adhered one on each outer surface of the pair of thin metal layers through the metal interlayer.

3. An interboard connection terminal according to claim 2, wherein the solder bumps and the metal interlayer are alternately stacked in a plurality of stages, and two externally located solder bumps are arranged one on each outer surface of a resultant stack layer.

4. An interboard connection terminal according to claim 2 or 3, wherein one of the two externally located solder bumps is connected to an electrode provided on a chip and the other solder bump is connected to an electrode of a wiring board.

5. An interboard connection terminal according to claim 2, wherein the pair of solder bumps fused through the metal interlayer are separately arranged as a plurality of pairs of solder bumps by separately arranging a plurality of metal interlayers on a single surface.

6. An interboard connection terminal according to claim 5, wherein the plurality of metal interlayers are supported either in or on a support board, thereby separately arranging the plurality of pairs of solder bumps.

7. An interboard connection terminal according to claim 5 or 6, wherein the solder bumps separately arranged are stacked in a plurality of stages such that the respective solder bumps are stacked sequentially with the metal interlayers interposed therebetween.

8. An interboard connection terminal according to claim 5 or 6, wherein one of the solder bumps is connected between an electrode formed on a chip and between an electrode formed on a wiring board.

9. An interboard connection terminal according to claim 2, wherein a melting point of one of the pair of solder bumps is different from that of a remaining one thereof.

10. An interboard connection terminal according to any one of claims 3, 5 or 6, wherein the solder bumps of a plurality of stages have different melting points in units of stages.

11. An interboard connection terminal according to claim 7, wherein one of the solder bumps is connected between an electrode formed on a chip and an electrode formed on a wiring board.

12. An interboard connection terminal according to claim 4, wherein the solder bumps of a plurality of stages have different melting points in units of stages.

13. An interboard connection terminal according to claim 7, wherein the solder bumps of a plurality of stages have different melting points in units of stages.

* * * * *

UNITED STATES PATENT AND TRADEMARK OFFICE
CERTIFICATE OF CORRECTION

PATENT NO. : 4,783,722
DATED : Nov. 8, 1988
INVENTOR(S) : OSAKI et al

It is certified that error appears in the above-identified patent and that said Letters Patent is hereby corrected as shown below:

TITLE PAGE, UNDER "FOREIGN PATENT DOCUMENTS" INSERT

| | | |
|---|---|---|
| -- 6,164,186 | 4/86 | JAPAN |
| 5,598,840 | 7/80 | JAPAN |
| 59,396 | 1/84 | JAPAN |
| 58 101,493 | 6/83 | JAPAN |
| 2,103,420 | 2/83 | ENGLAND |
| 7,533,874 | 7/76 | FRANCE |
| 0,013,562 | 7/80 | EUROPE -- |

Signed and Sealed this

Twenty-sixth Day of September, 1989

Attest:

DONALD J. QUIGG

Attesting Officer

Commissioner of Patents and Trademarks